United States Patent
Low et al.

(10) Patent No.: US 7,361,913 B2
(45) Date of Patent: Apr. 22, 2008

(54) METHODS AND APPARATUS FOR GLITCH RECOVERY IN STATIONARY-BEAM ION IMPLANTATION PROCESS USING FAST ION BEAM CONTROL

(75) Inventors: Russell J. Low, Rowley, MA (US); Joseph C. Olson, Beverly, MA (US); David R. Timberlake, Marblehead, MA (US); James R. McLane, Beverly, MA (US); Mark D. Saunders, Rockport, MA (US); James J. Cummings, Wilmington, MA (US); Thomas B. Callahan, Gloucester, MA (US); Jonathan England, Broadbridge Heath Horsham (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 120 days.

(21) Appl. No.: 11/241,894

(22) Filed: Sep. 30, 2005

(65) Prior Publication Data

US 2006/0219954 A1 Oct. 5, 2006

Related U.S. Application Data

(60) Provisional application No. 60/667,722, filed on Apr. 2, 2005.

(51) Int. Cl.
*G21K 5/10* (2006.01)
*H01J 37/08* (2006.01)

(52) U.S. Cl. .............................. 250/492.21; 250/492.3; 250/397; 250/492.1; 250/492.22; 250/492.2; 438/961; 438/514; 438/14; 315/111.81

(58) Field of Classification Search ............. 250/492.3, 250/397, 492.1, 492.21, 492.22, 492.2; 438/961, 438/514, 14; 315/111.81
See application file for complete search history.

(56) References Cited

U.S. PATENT DOCUMENTS

| 4,433,247 A | 2/1984 | Turner |
| 4,922,106 A | 5/1990 | Berrian et al. |
| 6,965,116 B1 * | 11/2005 | Wagner et al. ......... 250/492.21 |
| 7,005,657 B1 | 2/2006 | Low et al. |
| 2002/0089288 A1 * | 7/2002 | Keller .................... 315/111.81 |
| 2004/0227105 A1 | 11/2004 | Benveniste et al. |
| 2005/0181584 A1 * | 8/2005 | Foad et al. ................ 438/514 |

FOREIGN PATENT DOCUMENTS

EP 1 306 879 A2 5/2003

OTHER PUBLICATIONS

White, R. W., Sieradzki, M and Renau, A. "The Ion Beam Optics of a Single Wafer High Current Ion Implanter", Proceedings of the Eleventh International Conference on Ion Implantation Technology North Holland (1997), pp. 396 to 399.*
Berrian, D.W., Kaim, R. E. and Vanderpot, J. W. "In Situ Uniformity Control, Dose Monitoring and Correction", Nulcear Instruments and Methods in Physics Research B37/38 (1989), pp. 518 to 520.*

* cited by examiner

*Primary Examiner*—Jack I. Berman
*Assistant Examiner*—Meenakshi S Sahu (57) ABSTRACT

An ion implanter includes a source of a stationary, planar ion beam, a set of beamline components that steer the ion beam along a normal beam path as determined by first operating parameter values, an end station that mechanically scans the wafer across the normal beam path, and control circuitry that responds to a glitch in the ion beam during implantation pass to (1) immediately alter an operating parameter of at least one of the beamline components to a second value to direct the ion beam away from the normal beam path and thereby cease implantation at an implantation transition location on the wafer, (2) subsequently move the wafer to an implantation-resuming position in which the implantation transition location on the wafer lies directly on the normal path of the ion beam, and (3) return the operating parameter to its first value to direct the ion beam along the normal beam path and resume ion implantation at the implantation transition location on the wafer. The operating parameter may be an output voltage of an extraction power supply, or other voltages and/or currents of beamline components that affect the path of the ion beam.

18 Claims, 9 Drawing Sheets

METHODS AND APPARATUS FOR GLITCH RECOVERY IN STATIONARY-BEAM ION IMPLANTATION PROCESS USING FAST ION BEAM CONTROL

CROSS REFERENCE TO RELATED APPLICATIONS

This application claims the benefit under 35 U.S.C. § 119(e) of U.S. Provisional Patent Application No. 60/667, 722 filed on Apr. 2, 2005 entitled, "METHODS AND APPARATUS FOR GLITCH RECOVERY IN SEMICONDUCTOR ION IMPLANTATION PROCESS", the contents and teachings of which are hereby incorporated by reference in their entirety.

BACKGROUND

The present description is directed to methods and apparatus for recovering from "glitches" of an ion beam during ion implantation of semiconductor wafers, specifically in stationary-beam ion implanters that employ a planar or so-called "ribbon" beam. A glitch is a sudden transient in the beam current that can adversely affect the dose uniformity of the implanted species on the wafer. It has been common in the past to interrupt an implantation pass or scan by extinguishing the ion beam when a glitch is detected, leaving the wafer with only a partial implantation from the pass. The beam is extinguished by de-energizing the plasma arc within the source chamber. Subsequently, after the ion beam has been re-established, a second implantation pass (called a "recovery" pass) is begun that proceeds in the opposite direction along the wafer and is terminated at exactly the location where the first pass was interrupted, such that the wafer has received a single uniform dose across its surface.

One problem with the prior glitch recovery technique is the possibility of a second glitch occurring during the recovery pass, such that a central section of the wafer has not yet received the desired dose (especially on the last pass). It has generally not been possible in ribbon-beam ion implanters to re-establish the ion beam as quickly as would be necessary to begin a third pass (second recovery pass) at precisely the point at which either the first or second pass was interrupted. In some cases, the wafer must be scrapped, or other undesirable measures employed. There are other situations in which it would be desirable to have the ability to quickly establish an ion beam so as to resume implantation at a precise location on a wafer.

SUMMARY

A ion implanter and operating method are disclosed in which a stationary, planar ion beam is quickly re-directed away from the normal ion beam path upon occurrence of a glitch and then back to the normal path upon resumption of an implantation at a precise implantation-resuming position. The disclosed technique can be used in a variety of glitch scenarios including recovering from a second glitch that occurs during the recovery from a first glitch.

The disclosed method includes performing an ion implantation pass by mechanically scanning the wafer across a normal beam path, the normal beam path being traveled by a stationary, planar ion beam as determined by respective first values of respective operating parameters of a plurality of beamline components. The beamline components are those that can affect the path of travel of the ion beam in the implanter, including for example the extraction power supply.

In response to the detection of a glitch in the ion beam during the implantation pass, at least one operating parameter of at least one of the beamline components is substantially immediately altered to a respective second value effective to direct the ion beam away from the normal beam path and thereby cease implantation of the wafer at an implantation transition location on the wafer. As an example, the extraction power supply voltage is re-programmed to a second value, which may be for example approximately 95% of its normal (first) value, which is sufficient to direct the ion beam away from the mass resolving slit of an analyzer and therefore away from the wafer.

While the ion beam is directed away from the normal beam path, the wafer is moved to an implantation-resuming position in which the implantation transition location on the wafer lies directly on the normal path of the ion beam. As the wafer reaches the implantation-resuming position, the at least one operating parameter of the at least one beamline component is substantially immediately returned to its respective first value to thereby direct the ion beam along the normal beam path and resume ion implantation at the implantation transition location on the wafer.

The disclosed technique may be applied to alternative implanted substrates such as flat glass display panels.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
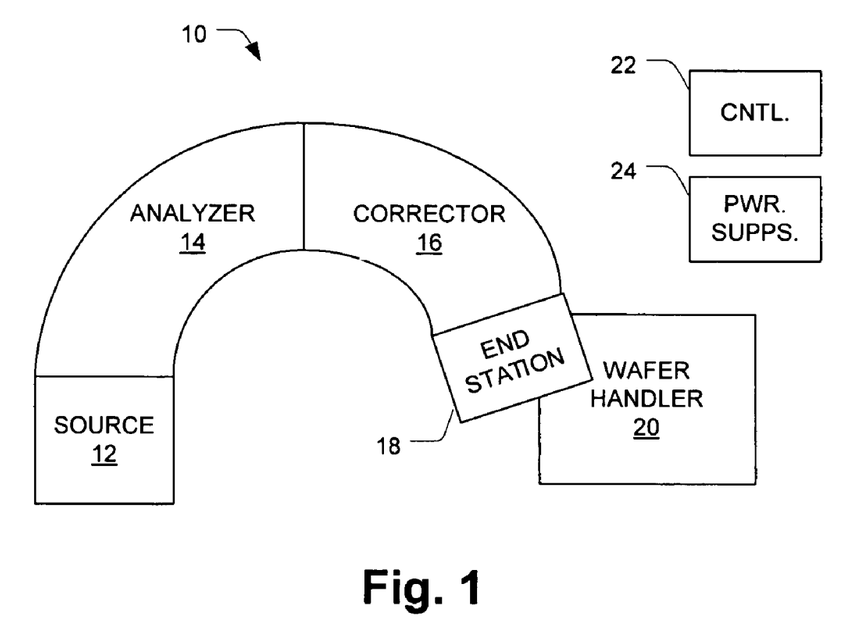
FIG. 1 is a block diagram of an ion implanter in accordance with the present invention.

FIG. 1 shows an ion implanter 10 including a source module 12, analyzer module 14, corrector module 16, and end station 18. Immediately adjacent to the end station 18 is a wafer handler 20. Also included are control circuitry (CNTL) 22 and power supplies (PWR SUPPS) 24, which although shown in respective separate blocks in FIG. 1 are actually distributed throughout the ion implanter 10 as known to those in the art.

During an implantation operation, the source module 12 is fed with a gaseous compound including the element(s) to be implanted into a semiconductor wafer. As an example, for the implantation of boron (B), gaseous boron fluoride ($BF_3$) is supplied to the source module 12. The source module 12 employs electrical excitation to form a plasma that generally includes a number of ion species resulting from fractionation of the source compound, including the desired species (e.g., B+) that is to be implanted. As the source module 12 is biased to a relatively positive potential, the positively charged ion species are extracted from the source module 12 by acceleration out to ground potential, which is negative with respect to the positively biased source module 12. The extracted ion species form an ion beam that enters the analyzer module 14.

The analyzer module 14 includes a magnet that imparts a bend to the ion beam from the source module 12. The amount of bend varies slightly for the different ion species of the beam, depending on the charge state, potential, and mass. Thus, as the beam travels toward the corrector module 16 through the analyzer module 14, it spreads out slightly due to the different trajectories of the different ion species. At the exit end, the analyzer module 14 has a narrow resolving slit or opening (not shown in FIG. 1) through which only the species of interest (e.g., B+) passes, while the other species are collected by a conductive plate surrounding the resolving opening. Thus, at the exit of the analyzer module 14, the ion beam consists almost exclusively of the desired ion species.

As the beam of desired species enters the corrector module 16, the beam can be diverging. Thus, the role of the corrector module 16 is to condition the beam such that it is suitable for the implantation operation. For an implanter employing a planar or "ribbon" beam as described further below, the corrector module 16 flattens the beam to impart the ribbon-like shape. In one embodiment, the end station 18 includes mechanical wafer scanning apparatus (not shown) that scans a wafer across the beam (which is stationary) to effect the implantation. The wafer handler 20 is a clean, robotic mechanical system for transferring wafers between a human operator of the system and the scanning apparatus.

Figure 2:
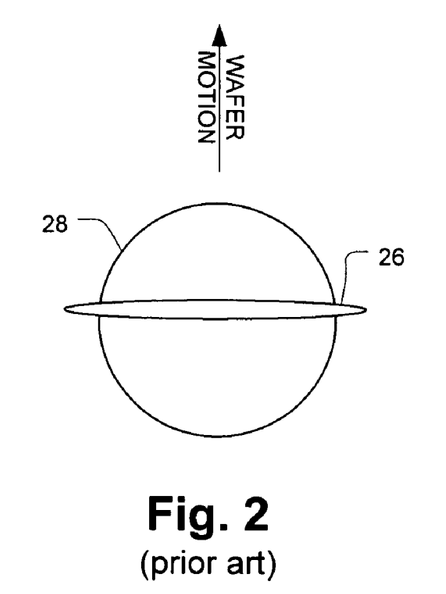
FIG. 2 is a schematic illustration of the mechanical scanning of a wafer through a stationary planar or "ribbon" ion beam as known in the art.

FIG. 2 illustrates implantation as viewed along the axis of an ion beam 26 within the end station 18. It will be observed that the ion beam 26 has a flattened or ribbon-like cross section. As mentioned, the ion beam 26 is stationary within the end station 18, i.e., there is no mechanism for deflecting the beam in a controlled manner as part of the implantation operation. Rather, each wafer 28 is mechanically scanned across the path of the beam 26, such as in the upward direction indicated in FIG. 2. Multiple passes are generally employed for a given implantation. It will be appreciated that the beam energy is selected to achieve a desired implantation depth, and the beam current and wafer scan speed are selected to achieve a desired dose rate, such that the overall operation yields a uniform desired dose on the wafer 28.

As mentioned above, beam transients or instabilities (referred to as "glitches") can occur that deleteriously affect the implantation (dosing) of the wafer 28 in the absence of remedial measures. When a glitch occurs during the implantation of a given wafer 28, it is common to employ a remedial recovery process to somehow complete the implantation with an acceptably uniform overall profile. First, an in-progress implantation is quickly stopped when the glitch is detected, thus localizing the boundary of the implanted area on the wafer 28. The wafer 28 may then be scanned from the opposite direction, for example, and the ion beam quickly extinguished at the same location at which it was extinguished when the glitch occurred. However, as mentioned above, such measures may have limited effectiveness, and cannot be used when multiple glitches occur for a given implantation pass during the processing of a single wafer.

Figure 3:
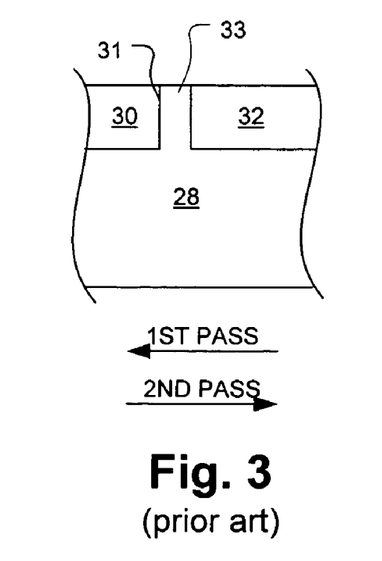
FIG. 3 is a schematic illustration of a particular type of under-dosing of a semiconductor wafer that can occur during ion implantation as known in the art.

FIG. 3 shows the result of processing in a particular multiple-glitch scenario. The wafer 28 is shown in side cross section. It is assumed that the wafer 28 is being scanned from right to left initially, such that a first implanted region 30 is formed during the initial part of the operation, prior to the occurrence of the glitch. It will be observed that the region 30 has a fairly steep trailing-edge side wall 31. This can be achieved in existing ion implanters by quickly extinguishing the ion beam, such as by abruptly switching off the power supply that feeds the plasma within the source module 12. Thus in FIG. 3 the side wall 31 represents a location of non-uniform dosing due to the occurrence of a glitch.

Subsequently, the wafer 28 is moved left-to-right, and a second implanted region 32 is formed. Ideally, the region 32 has the same dose as the region 30, and the implantation is stopped at exactly the location of the side wall 31 of the region 30, so that the two regions 30 and 32 abut each other to form one overall region that is acceptably uniform across the entire wafer 28. However, FIG. 3 illustrates the result when a second glitch occurs before the second implantation 32 is complete, leaving a gap 33. If the gap 33 is to be filled, it requires that the ion beam be switched on and off abruptly while the wafer 28 is scanned in its path. This is different from the first two passes, in which the beam is already established before the scanning begins and the implantation proceeds inwardly from a respective side of the wafer. While a fast switching "off" of the beam at the source 12 is possible, a fast "on" is generally not. The process of striking a plasma of sufficient strength to re-establish the desired ion beam current is slow, so it is generally not possible to achieve a regulated beam current over a very short interval of the wafer 28 at normal wafer scanning speeds. In the scenario of FIG. 3, then, it has generally been the case that the wafer 28 is unusable and must be scrapped.

Figure 4:
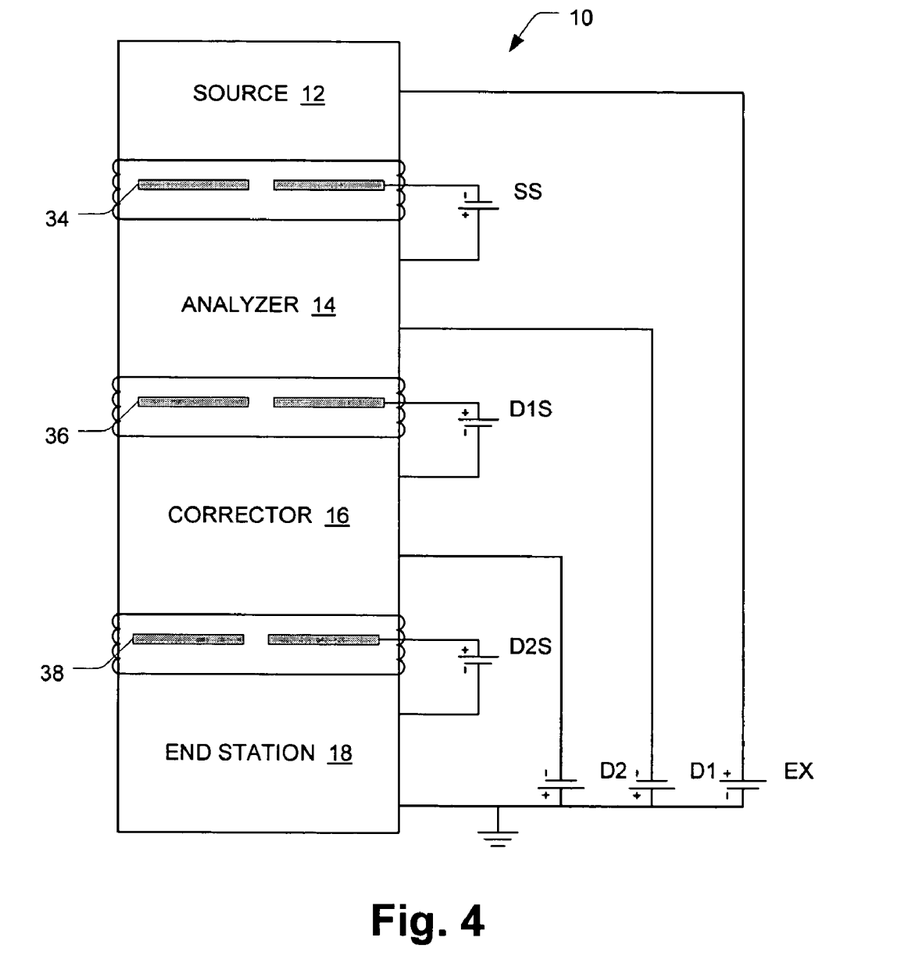
FIG. 4 is a block diagram showing several power supplies included in the ion implanter of FIG. 1.
Figure 6:
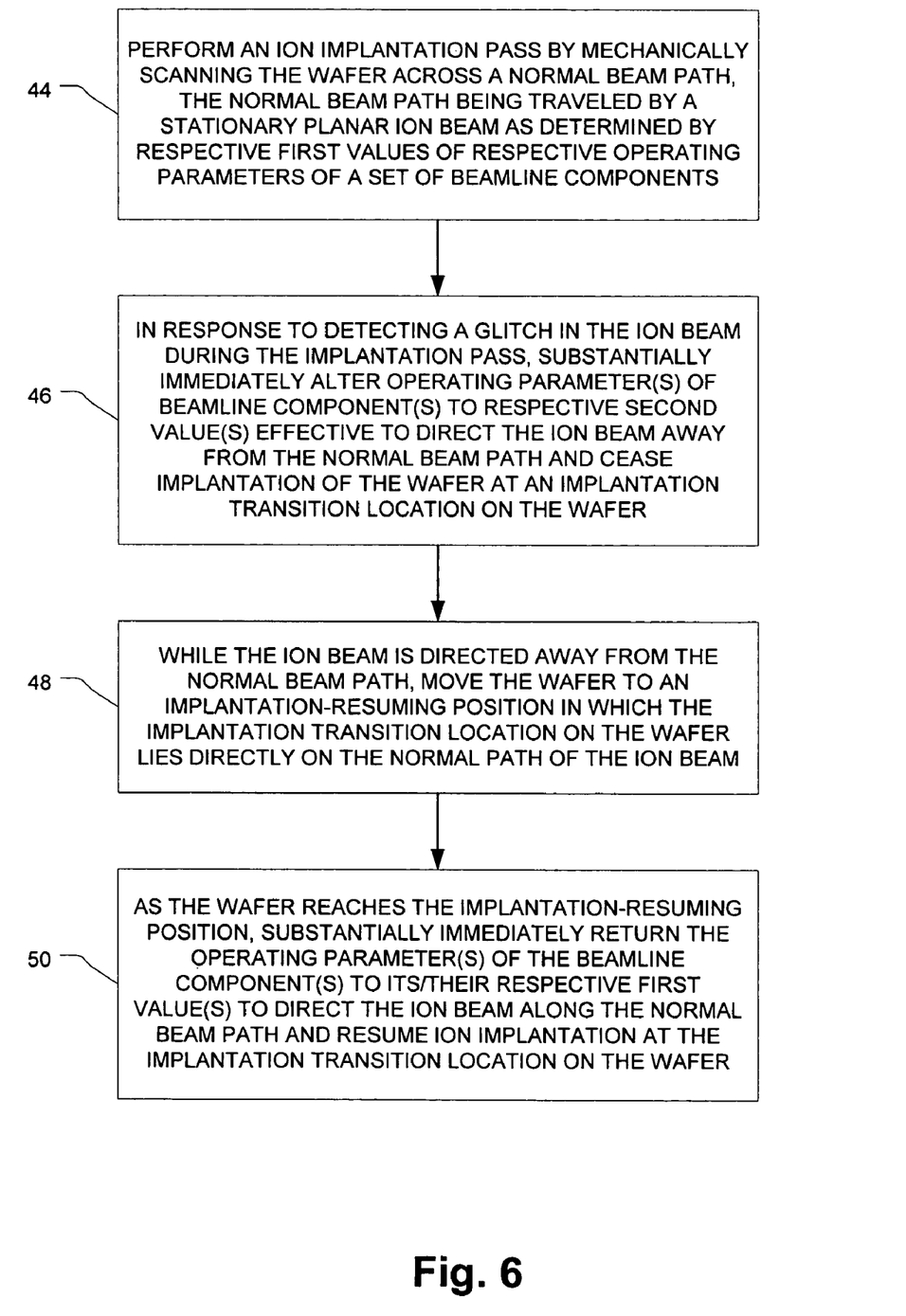
FIG. 6 is a flow diagram of a method for operating the ion implanter of FIG. 1 including the detection of an occurrence of under-dosing and recovering from such under-dosing.

FIG. 4 illustrates several power supplies used within the ion implanter 10. The extraction potential is established by an extraction supply EX coupled between the source module 12 and the end station 18, which is connected to ground potential. A first change in beam energy can be effected by a first deceleration power supply D1 coupled between the analyzer module 14 and the end station 18. A second change in beam energy can be effected by a second deceleration power supply D2 coupled between the corrector module 16 and the end station 18. Respective power supplies SS, D1S and D2S are connected between respective suppression electrodes 34, 36, and 38 and the respective modules 14, 16 or 18. Not shown in FIG. 6 are various diodes commonly used for protection purposes at different points within the ion implanter 10. In one embodiment, typical values for the various supplies are as shown in the table below. It will be appreciated that other supply voltages and supplies may be used in alternative embodiments.

| Supply | Value |
|---|---|
| EX | +10 kV |
| D1 | −30 kV |
| D2 | −10 kV |
| SS | −20 kV |
| D1 | −25 kV |
| D2S | −25 kV |

Figure 5:
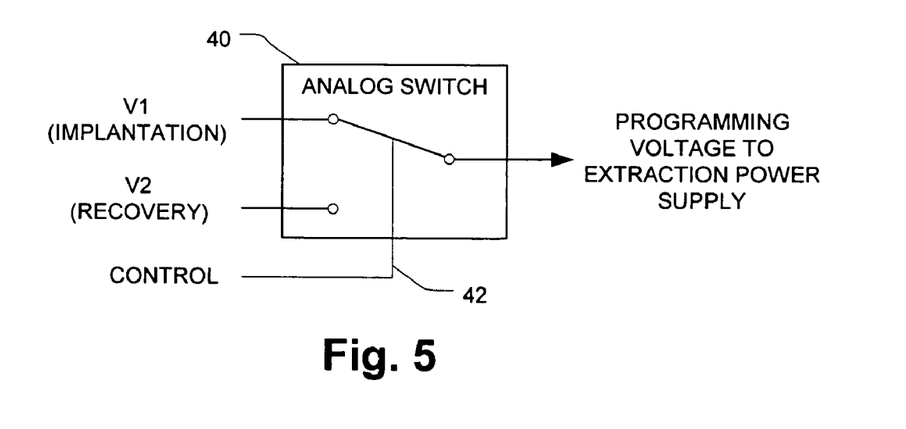
FIG. 5 is a schematic diagram of an analog switch via which the voltage output from an extraction power supply of FIG. 4 can be switched between a normal value and a lowered value for recovering from an occurrence of under-dosing as in FIG. 3 for example.

FIG. 5 illustrates apparatus for quickly re-programming the extraction power supply EX. An analog switch 40 is used to select between a first programming voltage V1 used during implantation and a second programming voltage V2 used during post-glitch recovery as described below. The selection is under the control of a control signal 42 from the control circuitry 22 (FIG. 1). The output of the switch 40 serves as the programming voltage provided to the extraction power supply EX, which responds to the value of the programming voltage by setting its output voltage to a corresponding value. As an example, when the programming voltage V1 is present on the output of the switch 40, the extraction voltage output from the extraction power supply EX may be +10 kV, and when the programming voltage V2 is present on the output of the switch 40, the extraction voltage output from the extraction power supply EX may be approximately 5% lower or +9.5 kV.

As described below, the switching of the extraction voltage from the extraction supply EX between two values using the switch 40 serves to quickly alter the path traveled by the ion beam in the implanter 10. It will be appreciated that the values for V1 and V2 required for each implantation species can be decided based on experimental data and modeling. If the ion implanter 10 is utilized for a variety of implantation operations involving different ion species, it may be convenient to use a look-up table to select the set of programming voltages to be used for any particular operation.

FIG. 6 shows a method of processing wafers that incorporates fast beam switching for glitch recovery. In step 44, a pass of ion implantation is performed by mechanically scanning the wafer 28 across a normal beam path, which is the path traveled by the stationary ion beam 26 as determined by a set of respective first values of operating parameters of a set of beamline components. Generally, the beamline components are those components distributed throughout the ion implanter 10 that affect the path of the ion beam 26. These include the extraction grid in the source 12, the deceleration lenses that are fed by the power supplies D1 and D2, the analyzer magnet 14, etc. The operating parameters for some of these components (e.g., extraction grid and deceleration lenses) include the values of the various power supplies shown in FIG. 4. The set of first values for these parameters are such as to establish the ion beam 26 on the normal beam path such that the implantation pass can be carried out by scanning the wafer 28 across the stationary ion beam 26. In the illustrated embodiment, the first values include the value V1 for the extraction power supply programming voltage, which is provided to the extraction power supply EX via the switch 40 of FIG. 5.

In step 46, the control circuitry 22 responds to the detection of a glitch in the ion beam during the implantation pass to substantially immediately alter at least one operating parameter of at least one of the beamline components to a respective second value, which is effective to direct the ion beam away from the normal beam path. Ion implantation ceases at a location on the wafer referred to as an "implantation transition location" on the wafer. In the illustrated embodiment, this step is performed by the switch 40 under control of the control signal 42. The setting of the switch 40 is changed such that the voltage V2 is provided as the programming voltage to the extraction power supply EX, which responds by lowering its output voltage by about 5%. As shown below, this change in extraction voltage is sufficient to alter the path of the ion beam 26 substantially away from the normal beam path such that implantation at the wafer is substantially immediately stopped.

In the illustrated embodiment, the mechanical scanning of the wafer 28 continues for some time notwithstanding the occurrence of the glitch. It may be desirable to permit the mechanical scan to complete normally or to interrupt the scan. But even if the scan is interrupted, it will be appreciated that the wafer 28 will have moved such that the implantation transition location will have moved away from the normal beam path. Thus, in step 48 the wafer is moved to an implantation-resuming position in which the implantation transition location on the wafer lies directly on the normal path of the ion beam. This step is performed while the ion beam 26 is still directed away from the normal beam path.

In step 50, as the wafer 28 reaches the implantation-resuming position, the at least one operating parameter of the at least one beamline component is returned to its respective first value substantially immediately. As a result, the ion beam 28 is again directed along the normal beam path and ion implantation resumes at the implantation transition location on the wafer.

FIGS. 7-15 illustrate the process of FIG. 6 in an operating scenario in which two glitches occur, the second during a recovery pass necessitated by the first. As noted above, this is a difficult scenario for known stationary-beam implanters because of their inability to quickly re-establish the ion beam at a precise location on the wafer 28, which is necessary in this two-glitch scenario.

Figure 7:
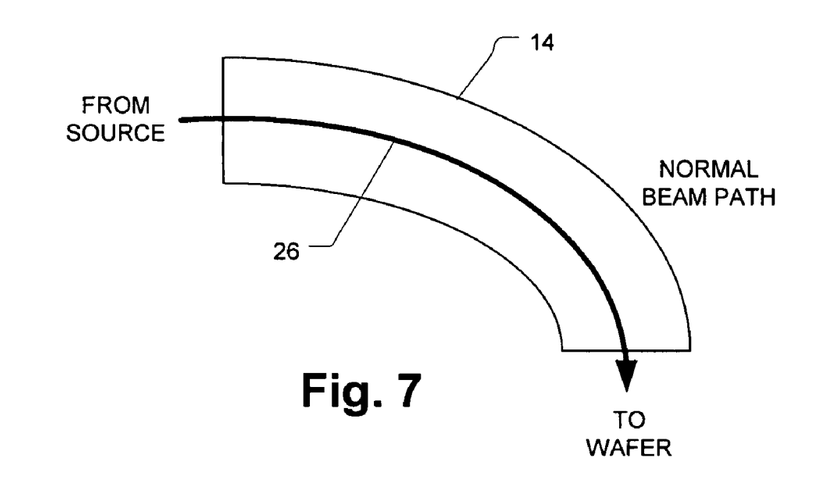
FIGS. 7-15 are diagrams showing the behavior of the ion beam and the processing of the wafer in the method of FIG. 6.
Figure 8:
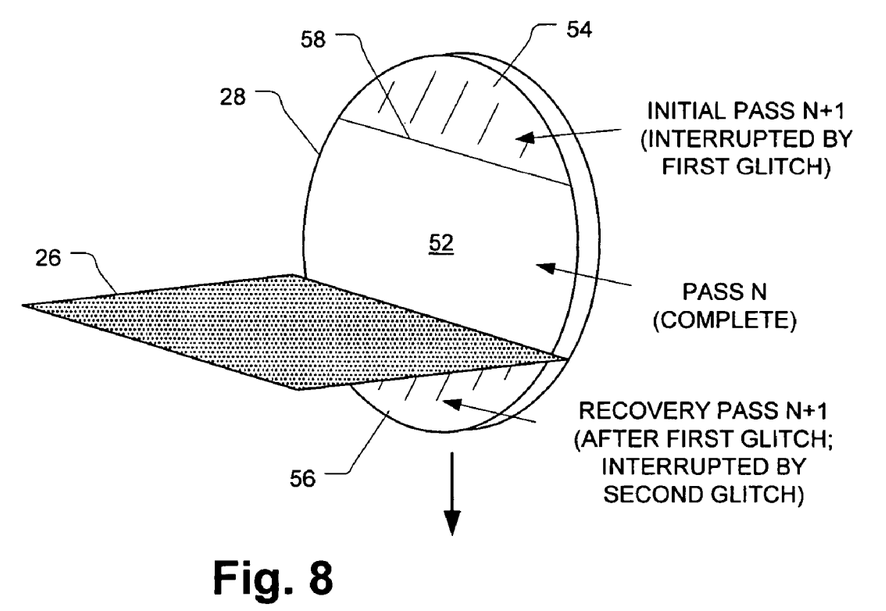

FIG. 7 shows the path of the ion beam 28 through an the analyzer 14, which is an arc-shaped path from the source 12 (at the left) toward a resolver opening (at the right) leading to the wafer. This is the normal operating condition during implantation. It is assumed that a first glitch is detected during an implantation pass, and that a first recovery pass is then initiated from the other side of the wafer. This situation is shown in FIG. 8. A prior pass N has been completed leaving the central part 52 of the wafer 28 at a corresponding dose. A first part of the next pass N+1 at top part 54 of the wafer 28 has been interrupted by a first glitch. Thus a recovery pass is being performed by scanning the wafer in the opposite direction, from the bottom 56 up towards the location 58 at which the first attempt at pass N+1 was interrupted.

It is now assumed that a second glitch occurs during this recovery pass. In response, the extraction power supply EX is immediately reprogrammed as described above, such that the ion beam 26 now travels a path away from its normal path. This situation is shown in FIG. 9, in which the ion beam 26 follows a generally straighter trajectory within the analyzer 14 such that substantially no ion beam current is emitted from the resolving opening toward the wafer 28.

Figure 10:
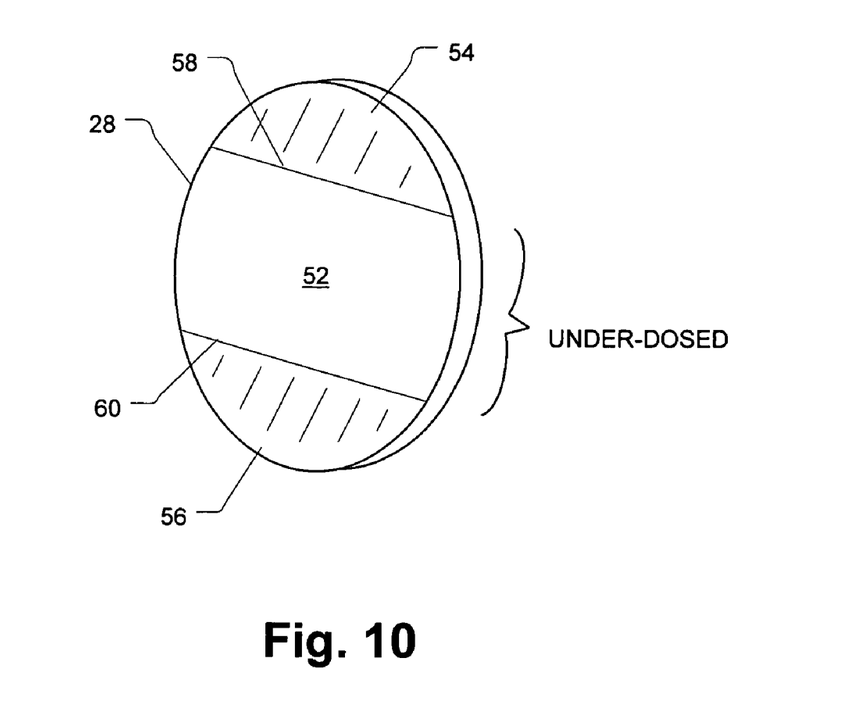

FIG. 10 shows the result on the wafer 28 when a glitch occurs during the recovery pass. The upper part 54 and lower part 56 of the wafer 28 have received the desired dose, but not the central section 52. The upper part 54 is bounded by a first implantation transition location 58, and the lower part 56 b y a second implantation transition location 60.

Figure 9:
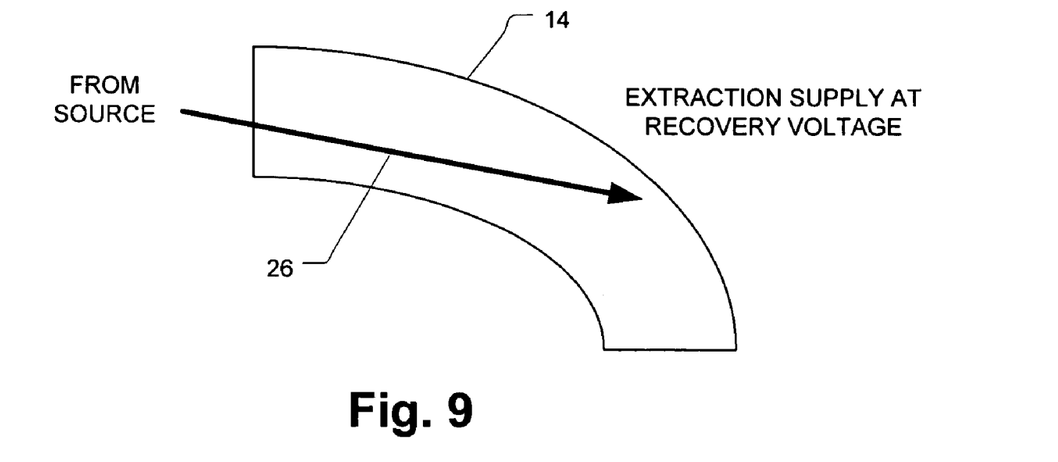
Figure 11:
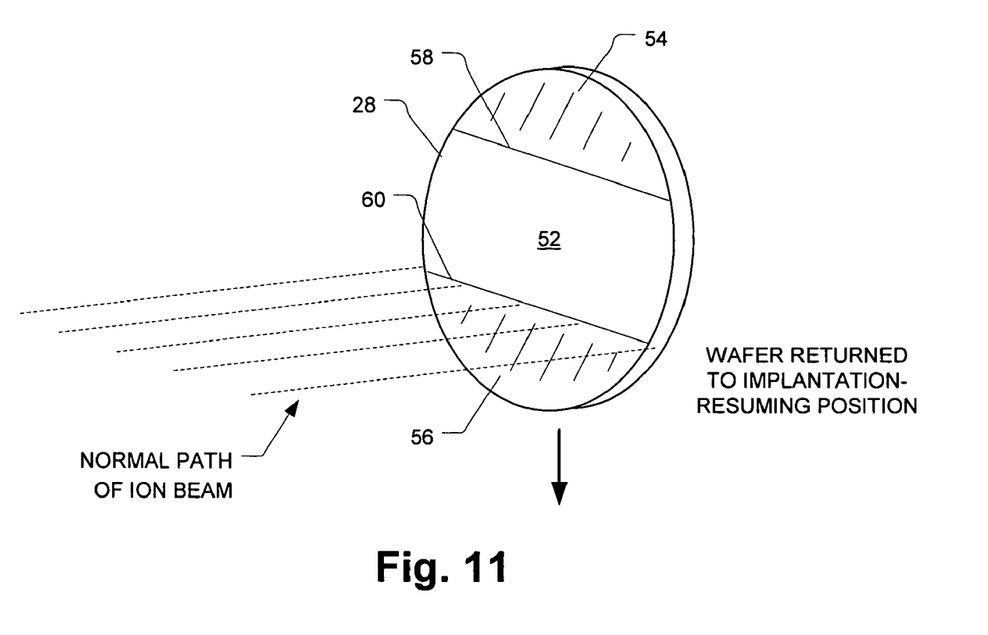
Figure 12:
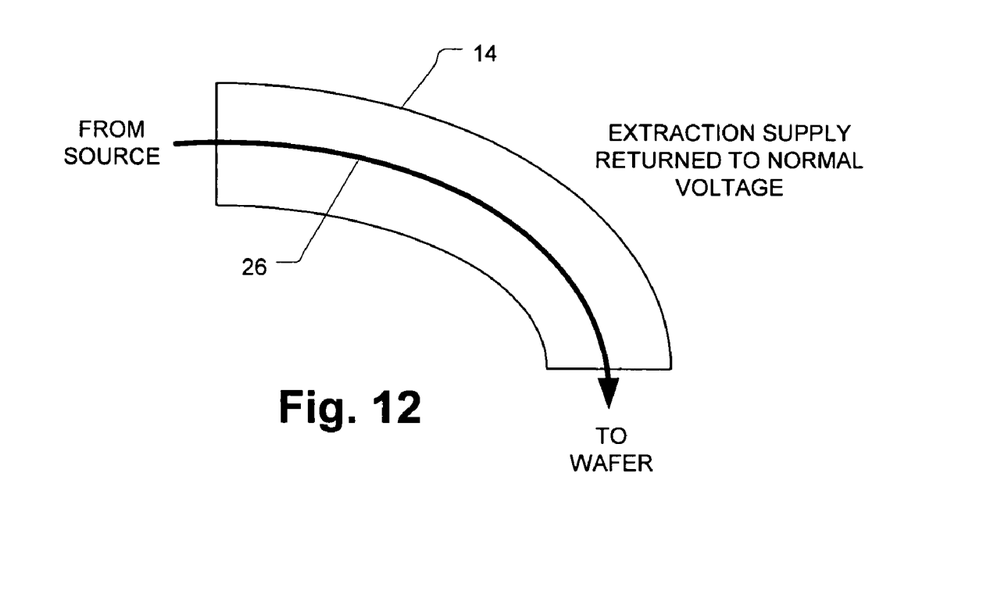
Figure 13:
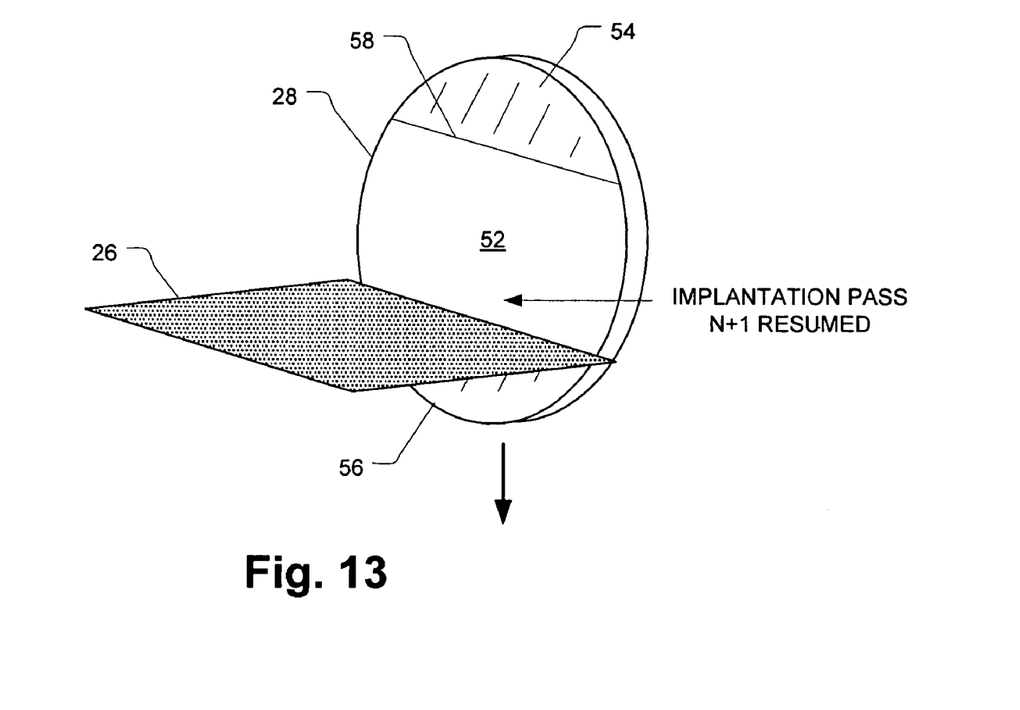

FIG. 11 shows the wafer 28 being brought to the implantation-resuming position in which the second implantation transition location 60 is aligned with the normal path of the ion beam 26, which is still directed away from the normal path as shown in FIG. 9. As the wafer 28 reaches the position shown in FIG. 11, the extraction power supply EX is reprogrammed to its original value such that the ion beam 26 is quickly re-directed along its normal path. This situation is shown in FIG. 12. At this point, the implantation pass N+1 resumes, as shown in FIG. 13.

Figure 14:
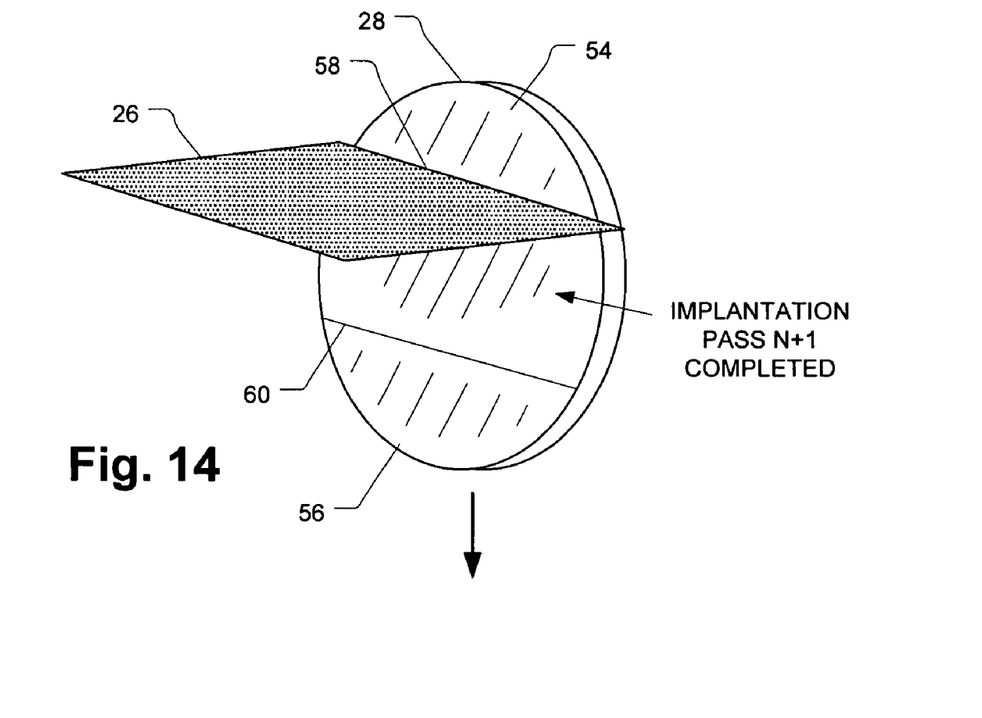
Figure 15:
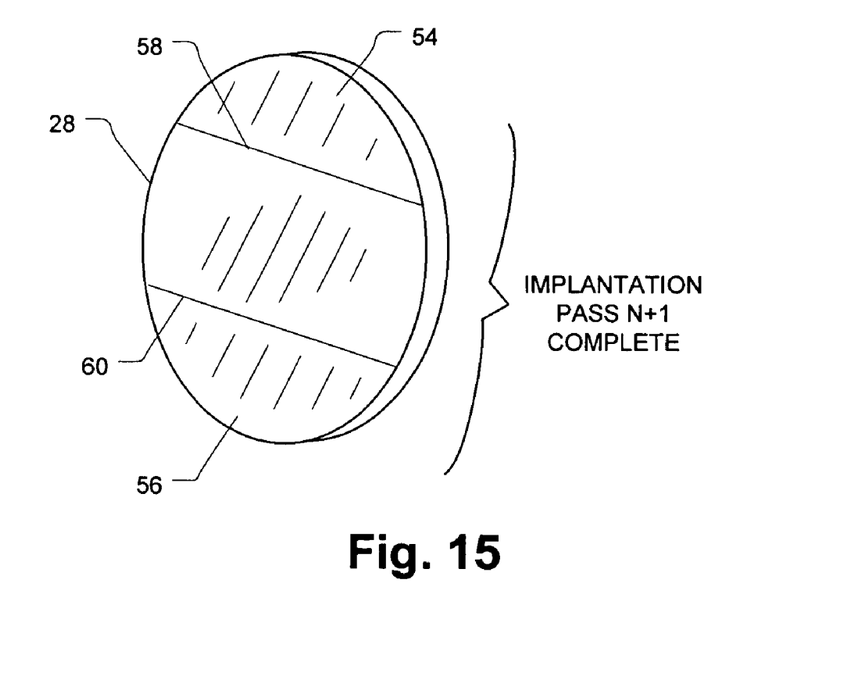

FIG. 14 shows the completion of implantation pass N+1 as the wafer 28 reaches the point at which the first implantation transition location 58 lies in the path of the ion beam 26. At this point, the implantation can be stopped either by re-directing the ion beam 26 away from the normal path, as shown in FIG. 9, or by removing the ion beam 26 entirely such as by quenching the arc within the source 12. If additional passes are necessary to complete the overall implantation operation, then such additional passes can now be performed in the usual manner.

In the illustrated embodiment, the path of the ion beam 26 is altered by changing the beam energy by changing the extraction voltage while leaving other operating parameters, notably the analyzer magnet current, the same. It is possible to change the beam energy at other places along the beam line. This can be achieved by varying the output of a one of the deceleration supplies D1 or D2 for example. Changing the deceleration supply voltage will change the beam path by changing the beam energy, whereas changing the magnet current will change the beam line while keeping the beam energy unchanged. In alternative embodiments, particularly high-energy ion implanters, the beam energy may be changed by varying the output of power supplies that drive beam-accelerating components rather than beam-decelerating components such as deceleration lenses.

It is generally faster to reduce the power supply voltage, so reduction in voltage is preferable. There may be cases were contamination could get to the wafer, so an increase in power supply potential may be preferable in such cases. Mathematical relationships relating beam energy to radius of curvature in a magnet are well known. It should also be noted that the specific power supply arrangement shown in FIG. 4 is but one of many possible arrangements that might be used in an ion implanter, and that the techniques described herein are likewise applicable to implanters having other arrangements of power supplies. As an example, there may be a single power supply that establishes a potential difference between an ion source and an analyzer magnet, and the voltage of this power supply can be switched to quickly change the beam energy and thereby direct the beam toward or away from a wafer being processed.

The techniques described above can be used by themselves or in combination with other mechanisms, e.g., arc quenching and/or beam deflection techniques. Another alternative approach is to use a "split" deceleration lens to steer the beam. Typically a deceleration lens is a single electrical element having a single voltage applied to it. If instead it is implemented as two separate elements, it can be used both for typical deceleration (driving both elements with the same voltage) and for beam steering (driving the elements with different voltages.

Another approach to quickly turn beam current on and off at the wafer is to employ active beam steering components. For example, a steering magnet can be placed along the beam path and used to deflect the beam vertically or horizontally. Such a steering magnet might be located, for example, at the entrance or exit of the resolver magnet. During normal implantation operation, the magnet permits the beam to travel the normal beam path to the wafer. When a glitch is detected, the magnet is energized to deflect the beam vertically or horizontally by a sufficient amount that beam current at the wafer is reduced to substantially zero. During a subsequent recovery pass, the magnet can be quickly de-energized to bring the beam back to its normal path as the edge of the under-dosed region approaches the beam path. This same mechanism can also be used to re-deflect the beam away from the wafer at the other end of the under-dosed region.

As an alternative to the above approach, it may be possible to steer the beam using magnets that are typically provided for focusing the beam. During normal operation, these magnets are controlled in the usual fashion to obtain the desired beam focus. Upon occurrence of a glitch, the magnets are provided with larger-amplitude inputs so as to exert a sufficiently large effect on the beam to steer it away from the wafer.

Figure 16:
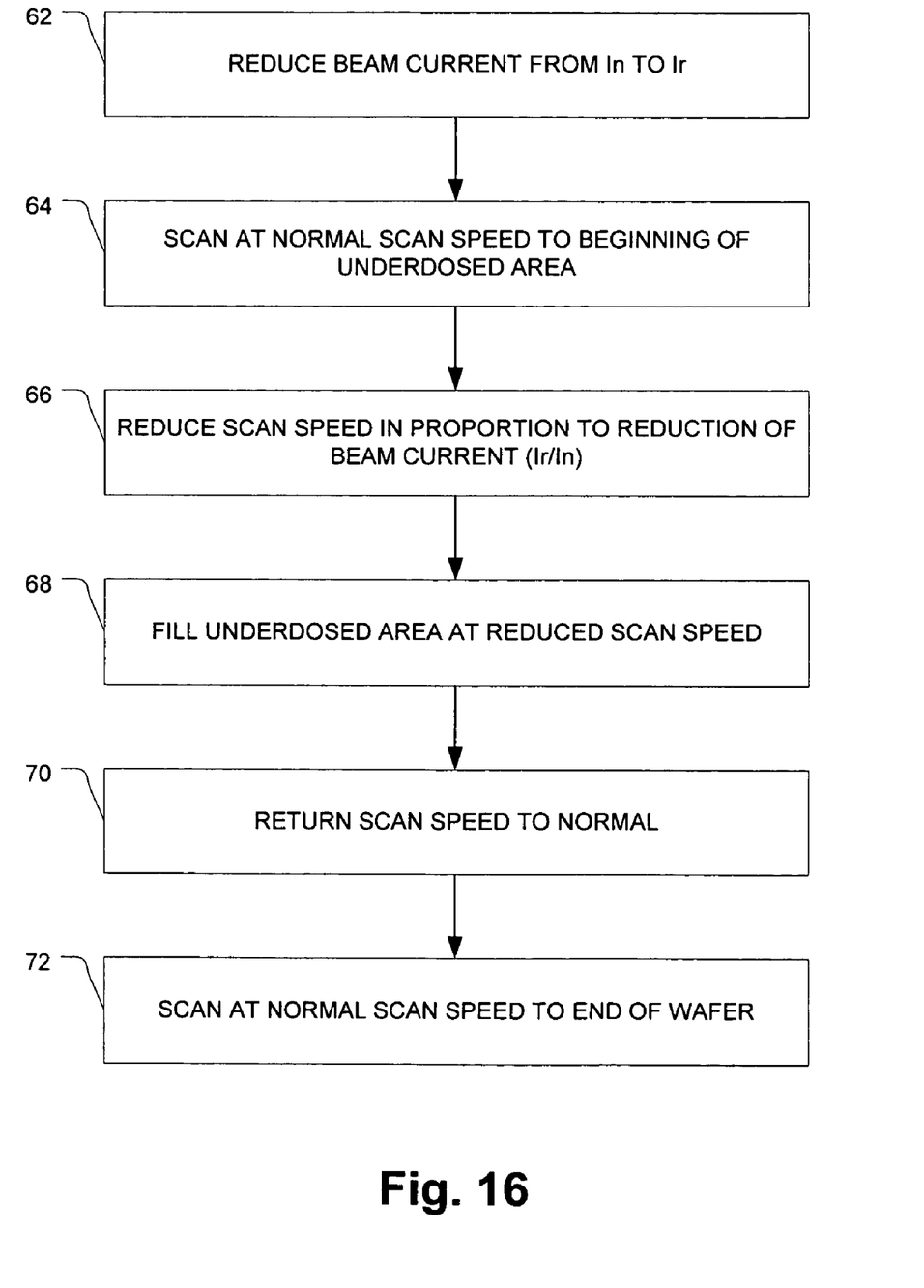
FIG. 16 is a flow diagram of a method of filling an under-dosed area using reduced-speed scanning in the ion implanter of FIG. 1.

FIG. 16 shows an alternative approach to filling in under-dosed areas such as the central area 52 of the wafer 28 (FIG. 10, e.g.), which involves reducing the beam current and controlling (or "profiling") the velocity at which the wafer is scanned. This approach has the benefit of not requiring the rapid switching of the ion beam 26.

In step 62, the ion beam current is reduced from its normal value In to a reduced value Ir, which may be on the order of 1% to 5% of In for example. This step is carried out while the wafer 28 is out of the normal beam path, and it can be accomplished in a variety of ways, as described below. In any particular embodiment, the amount of reduction of beam current will normally depend in part on the normal dose level and the number of scans or passes normally required for the implantation.

In step 64, the wafer is scanned at normal scan speed or at higher scan speed to the beginning of the under-dosed area, then in step 66 the scan velocity is reduced in proportion to the reduction of beam current. For example, if the beam current is reduced to 1% of normal, then the wafer scan velocity is also reduced to approximately 1% of its normal value. In step 68, implantation proceeds at the reduced scan speed until the end of the under-dosed region is reached. In step 70, the scan velocity is increased back to the normal (or higher) scan speed, and in step 72 the scanning is completed at the normal scanning speed. It will be appreciated that for the duration of the reduced-speed scan, the dose being received by the wafer is the same as that received by the wafer during normal operation, albeit much more slowly. The beam current and scan speed can be selected such that the overall resulting dose for the initial and recovery passes is uniform. Note that wafers could be stored up and processed at once with the lower beam current passes to reduce the impact on implanter productivity.

Beam current control and tuning has a number of elements. In the ion source, the control variables are gas flow, magnetic field, energy of electrons emitted by the cathode (called arc voltage), and cathode temperature (which regulates the amount of thermionically emitted electrons coming from the cathode and ionizing gas in the arc chamber to create ions). Cathode temperature is controlled either by passing a current through the cathode (directly heated) or by striking the cathode with energetic electrons (indirectly heated).

Ions are extracted from the plasma by an electric field created by a relative negative voltage on an extraction grid at an opening of the arc chamber. A control system includes a control loop that regulates the extraction current to a constant value, such as by regulating the cathode temperature. The extracted current is monitored through the power supplies (including the extraction power supply EX) that provide the current.

Beam current in the beam line can be measured using a Faraday cup, which is a cup shaped floating conductor grounded through current measuring electronics. The elements in the beam line that can be tuned (such as source magnet field, extraction manipulator position, analyzer magnet current, voltage on focusing electrodes etc.), are generally adjusted to maximize the current detected in the Faraday cup. Uniformity and angles are measured with a Faraday cup that is mechanized and can translate across the beam to measure beam current as a function of position.

As mentioned above, the beam current can be reduced for a recovery pass in a variety of ways. In one approach, the normal beam set-up process can be repeated but having the reduced beam current as the target. Alternatively, the beam current from the source can be left at its normal value, but the beam current to the wafer can be reduced by narrowing a mechanical aperture along the beam line, which may be located for example near the mass resolving slit. As yet another alternative, a dilution gas can be introduced into the source chamber, reducing the source gas concentration such that the level of extraction of ion species is reduced. This tuning of the beam can be accomplished by an operator, an automated sequence in the implanter's control circuitry, or some combination of the two. It is important that the beam current be checked before beginning the recovery pass. Also, on a broad-beam implanter such as described herein, it may be necessary to check that the beam is uniform and parallel, and that the beam angle with respect to the wafer is correct.

It should be noted that the method of FIG. 16 is likewise applicable to stationary-beam wafer-scanning implanters such as those that employ static "spot" beams, i.e., beams having a generally circular cross section much smaller than the wafer 28. Such implanters generally employ mechanical scanning of the wafer 28 in both the horizontal and vertical directions during an implantation operation.

While this invention has been particularly shown and described with references to preferred embodiments thereof, it will be understood by those skilled in the art that various changes in form and details may be made therein without departing from the spirit and scope of the invention as defined by the appended claims.

For example, although the disclosed methods and apparatus are shown used in conjunction with the processing of semiconductor wafers in particular, it will be appreciated that the disclosed techniques may be applied to other substrates that are to receive an ion implantation. One notable type of implanted substrate is a flat glass display panel. The disclosed techniques may also be usable with other types of alternative implanted substrates.

What is claimed is:

1. A stationary-beam ion implanter operative to perform an ion implantation in a semiconductor wafer, comprising:
a source of a stationary, planar ion beam;
a plurality of beamline components operative to steer the ion beam along a normal beam path as determined by respective first values of respective operating parameters of the beamline components;
an end station operative to mechanically scan the wafer across the normal beam path; and control circuitry operative, in response to detecting a glitch in the ion beam during the implantation pass, to:
substantially immediately alter at least one operating parameter of at least one of the beamline components to a respective second value effective to direct the ion beam away from the normal beam path and thereby cease implantation of the wafer at an implantation transition location on the wafer;
while the ion beam is directed away from the normal beam path, move the wafer to an implantation-resuming position in which the implantation transition location on the wafer lies directly on the normal path of the ion beam; and
as the wafer reaches the implantation-resuming position, substantially immediately return the at least one operating parameter of the at least one beamline component to its respective first value to thereby direct the ion beam along the normal beam path and resume ion implantation at the implantation transition location on the wafer.

2. An ion implanter according to claim 1, wherein the at least one operating parameter of at least one of the beamline components comprises an operating voltage potential established as an output voltage of a power supply.

3. An ion implanter according to claim 2, wherein the power supply is an extraction power supply.

4. An ion implanter according to claim 2, wherein the second value of the output voltage of the power supply is an intermediate value between zero and the first value of the output voltage of the power supply.

5. An ion implanter according to claim 4, wherein the second value of the output voltage of the power supply is approximately 95% of the first value of the output voltage of the power supply.

6. An ion implanter according to claim 5, wherein the power supply is an extraction power supply.

7. An ion implanter according to claim 2, wherein the second value of the output voltage of the power supply is a higher value greater than the first value of the output voltage of the power supply.

8. An ion implanter according to claim 2, wherein the power supply is a deceleration power supply.

9. An ion implanter according to claim 2, wherein the power supply is an acceleration power supply.

10. An ion implanter according to claim 1, wherein the at least one operating parameter of at least one of the beamline components includes respective voltages supplied to respective parts of a split deceleration lens.

11. An ion implanter according to claim 1, wherein the at least one operating parameter of at least one of the beamline components is the current in an analyzer magnet.

12. A stationary-beam ion implanter operative to fill in an under-dosed area of a semiconductor wafer, comprising:
a source of an ion beam; an end station operative to mechanically scan the wafer across a path of the ion beam; and
control circuitry operative to:
reduce the a current of the ion beam to a reduced non-zero ion beam current equal to a predetermined fraction of a normal ion beam current;
mechanically scan a first normally dosed area of the wafer across the reduced-current ion beam at a normal or higher scanning speed until the a first implantation transition location is reached;
when the first implantation transition location is reached, reduce the mechanical scanning speed of the wafer to a reduced scanning speed substantially equal to the predetermined fraction of the normal scanning speed;
scan the wafer across the reduced-current ion beam at the reduced scanning speed from the first implantation transition location to the a second implantation transition location; and
when the second implantation transition location is reached, increase the mechanical scanning speed of the wafer to the normal scanning speed or higher, and mechanically scanning the wafer across the reduced-current ion beam at the normal or higher scanning speed away from the second implantation location across a second normally dosed area of the wafer.

13. A stationary-beam ion implanter according to claim 12, wherein the ion beam is a planar ion beam, and the mechanical scanning of the wafer is in a direction orthogonal to the plane of the ion beam.

14. A stationary-beam ion implanter according to claim 12, wherein the ion beam is a spot beam, and the mechanical scanning of the wafer is in one of two orthogonal directions in which the wafer can be mechanically scanned within the ion implanter.

15. A stationary-beam ion implanter according to claim 12, wherein reducing the current of the ion beam comprises introducing a dilution gas into a source of the ion beam.

16. A stationary-beam ion implanter according to claim 12, wherein reducing the current of the ion beam comprises decreasing the size of a mechanical aperture through which the ion beam passes.

17. A stationary-beam ion implanter according to claim 16, wherein the mechanical aperture is located adjacent a mass resolving slit of the ion implanter.

18. A stationary-beam ion implanter according to claim 12, wherein reducing the current of the ion beam comprises directing the beam slightly away from a normal ion beam path traveled by the beam so as to slightly clip one side portion of the beam.

* * * * *